US006847263B2

(12) United States Patent
Denoyer et al.

(10) Patent No.: US 6,847,263 B2
(45) Date of Patent: Jan. 25, 2005

(54) OPTICAL RECEIVER WITH WIDE DYNAMIC RANGE TRANSIMPEDANCE AMPLIFIER

(75) Inventors: Gilles P. Denoyer, San Jose, CA (US); Daniel Case, Gilroy, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/839,640

(22) Filed: May 5, 2004

(65) Prior Publication Data

US 2004/0207473 A1 Oct. 21, 2004

Related U.S. Application Data

(63) Continuation of application No. 10/733,681, filed on Dec. 11, 2003, now Pat. No. 6,778,021, which is a continuation-in-part of application No. 10/371,847, filed on Feb. 21, 2003, now Pat. No. 6,771,132.
(60) Provisional application No. 60/429,129, filed on Nov. 26, 2002.

(51) Int. Cl.[7] .............................. H03F 3/08; H03F 1/36; H01J 40/14
(52) U.S. Cl. .................... 330/308; 330/110; 250/214 A
(58) Field of Search ................................ 330/308, 110; 250/214 A

(56) References Cited

U.S. PATENT DOCUMENTS

| | | | | | |
|---|---|---|---|---|---|
| 4,574,249 | A | * | 3/1986 | Williams | 330/59 |
| 5,304,793 | A | * | 4/1994 | Grasset | 250/214 A |
| 5,606,277 | A | * | 2/1997 | Feliz | 327/311 |
| 6,069,534 | A | * | 5/2000 | Kobayashi | 330/308 |
| 6,359,517 | B1 | * | 3/2002 | Colaco | 330/308 |

* cited by examiner

Primary Examiner—Patricia Nguyen
(74) Attorney, Agent, or Firm—Workman Nydegger

(57) ABSTRACT

An optical component is provided that includes a detector configured to transmit an input current to a transimpedance amplifier that includes an automatic transimpedance gain control and DC cancellation control feedback circuit having variable impedance circuitry. Open loop gain of the feedback circuit is independent of the average input current as the input current increases. The feedback circuit includes first and second pnp transistors arranged so that their respective bases are connected and so that an emitter terminal of the first pnp transistor is connected to the input of the transimpedance amplifier, and the impedance seen at the emitter terminal changes according to the average value of the input current. The emitter size of the second pnp transistor is a factor N smaller than emitter size of the first pnp transistor. N can be selected to adjust the gain control and low corner frequency variation with input power.

25 Claims, 7 Drawing Sheets

OPTICAL RECEIVER WITH WIDE DYNAMIC RANGE TRANSIMPEDANCE AMPLIFIER

RELATED APPLICATIONS

This application is a continuation of U.S. patent application Ser. No. 10/733,681, entitled "A Wide Dynamic Range Transimpedance Amplifier With A Controlled Low Frequency Cutoff At High Optical Power" and filed Dec. 11, 2003, now U.S. Pat. No. 6,778,021 which is a continuation-in-part of U.S. patent application Ser. No. 10/371,847, and entitled "A Wide Range Transimpedance Amplifier With A Controlled Low Frequency Cutoff At High Optical Power," filed Feb. 21, 2003, now U.S. Pat. No. 6,771,132 which, in turn, claims the benefit of U.S. Provisional Application No. 60/429,129, filed Nov. 26, 2002 and entitled "Circuit for Wide Dynamic Range Transimpedance Amplifier." All of the aforementioned applications are incorporated herein in their respective entireties by this reference.

BACKGROUND OF THE INVENTION

1. The Field of the Invention

The present invention generally concern optoelectronic components, such as optical receivers. More particularly, exemplary embodiments of the invention concern an optical receiver having a wide dynamic power range transimpedance amplifier. The transimpedance amplifier of the optical receiver has a controlled low cutoff frequency as an average input current received at the transimpedance amplifier increases.

2. Related Technology

Fiber optic networks use light signals to transmit data over a network. Although light signals are used to carry data, the light signals are typically converted into electrical signals in order to extract and process the data. The conversion of an optical signal into an electrical signal is often achieved utilizing a fiber optic receiver. A fiber optic receiver converts the optical signal received over the optical fiber into an electrical signal, amplifies the electrical signal, and converts the electrical signal into an electrical digital data stream.

The fiber optic receiver usually includes a photodiode that detects the light signal and converts the light signal into an electrical signal or current. A transimpedance amplifier amplifies the signal from the photodiode into a relatively large amplitude electrical signal. The amplified electrical signal is then converted into a digital data stream.

The optical signals that are converted into electrical signals by the fiber optic receiver, however, can vary significantly in both amplitude and power. The power of the optical signal is often related, for example, to the length (hence loss) of the optical fiber over which the optical signal was transmitted, the laser source power, the efficiency of the photodiode, etc. These and other factors result in optical signals whose incident power at the transimpedance amplifier can vary significantly.

Fiber optic receivers are only able to successfully receive and amplify optical signals that fall within a particular power range. In order for a fiber optic receiver to accommodate a wide range of optical signals, the fiber optic receiver and in particular, the transimpedance amplifier, should be able to detect and amplify very low levels of optical power as well as high levels of optical power. The range of signals that can be successfully amplified is therefore effectively limited by the incident optical power because the fiber optic receiver distorts or clamps signals whose optical power is too large and cannot recognize signals whose optical power is too low.

One problem with current transimpedance amplifiers is that extending the ability of the transimpedance amplifier to amplify signals with more optical power usually diminishes the ability of the transimpedance amplifier to amplify signals with low optical power. In other words, the maximum optical input power that can be accepted by the transimpedance amplifier while meeting signal integrity and bit error rate specifications is usually specified as the input optical overload. The minimum input power is specified as optical sensitivity. The transimpedance amplifier should be designed to maximize the optical overload and minimize the optical sensitivity. In most of the commercial or published transimpedance amplifiers, there is a direct tradeoff between the circuit optical (or current) sensitivity (or equivalent input current noise) and the optical (or current) overload. Some solutions to this problem, such as utilizing clamping circuitry or voltage regulators to assist in the amplification of optical signals with relatively large optical power, add both cost and complexity to the transimpedance amplifier of the fiber optical receiver. Without the aid of additional circuitry, the range of signals that can be successfully amplified is somewhat limited because the circuitry used for automatic gain control and DC cancellation introduces unwanted gain into the transimpedance amplifiers DC cancellation feedback loop at large optical power.

The unwanted gain also has an adverse effect on the low frequency cutoff at higher optical powers. In other words, transimpedance amplifiers do not function at certain frequencies because the low frequency cutoff has been increased. The low frequency cutoff for these types of transimpedance amplifiers is related to the transconductance of the circuitry used for automatic gain control and DC cancellation. Thus, as the current of the input signal increases, the low frequency cutoff of the transimpedance amplifier is adversely affected.

BRIEF SUMMARY OF AN EXEMPLARY EMBODIMENT OF THE INVENTION

These and other limitations are overcome by the present invention, which relates to an optoelectronic device that includes a wide dynamic power range transimpedance amplifier. In one exemplary embodiment of the present invention, an optical component, such as an optical receiver for example, is provided that includes a detector, such as a photodiode, configured to receive an optical signal and generate a corresponding input current, where the input current has a magnitude that varies with the magnitude of the received optical signal.

A transimpedance amplifier is also included in the optical component. The transimpedance amplifier has a controlled low cutoff frequency as an average input current received from the detector at an amplifier input of the transimpedance amplifier increases. In this exemplary implementation, the transimpedance amplifier includes a forward transimpedance circuit configured to receive the input current from the detector and to generate an output signal based on the received input current. In addition, the transimpedance amplifier includes a feedback circuit having a first circuit configured to detect a low frequency component of the output signal, and a second circuit that is driven by the low frequency component of the output signal.

The second circuit is connected to the forward transimpedance circuit such that the impedance of the second circuit presented at the amplifier input decreases as the output signal increases. In this implementation, the second circuit includes a first pnp transistor that has a base terminal, as well as an emitter terminal that is connected to the amplifier input. The second circuit further includes a second pnp transistor having a base terminal that is connected to the base terminal of the first pnp transistor. The second pnp transistor has an emitter size that is a factor smaller than an emitter size of the first pnp transistor.

Among other things, this arrangement ensures that the optical sensitivity associated with the transimpedance amplifier is not traded for optical overload. In addition, the low cutoff frequency does not increase linearly but approaches an upper limit or is controlled as the input current to the transimpedance amplifier increases. Thus, at least some embodiments of the invention are well suited for use in connection with legacy systems that may operate at lower frequencies. These and other aspects of embodiments of the present invention will become more fully apparent from the following description and appended claims.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF EXEMPLARY EMBODIMENTS OF THE INVENTION

The present invention relates to a wide dynamic range transimpedance amplifier. The present invention more particularly relates to a wide dynamic range transimpedance amplifier with automatic gain control and direct current (DC) cancellation control. The automatic gain control and direct current cancellation control are achieved in one embodiment using variable impedance circuitry whose impedance is controlled by or related to the average photodiode current. The variable impedance circuitry does not introduce significant open loop gain into the low frequency DC/AGC cancellation feedback loop of the transimpedance amplifier. In addition to automatic gain control and direct current cancellation, the optical sensitivity of the transimpedance amplifier is not reduced while the optical overload is increased.

As the average photodiode current increases, the impedance of the variable impedance circuitry decreases. The variable impedance circuitry cancels the DC component of the input signal and attenuates the AC component of the input signal, thereby providing automatic gain control while canceling the DC component of the input signal.

Figure 1:
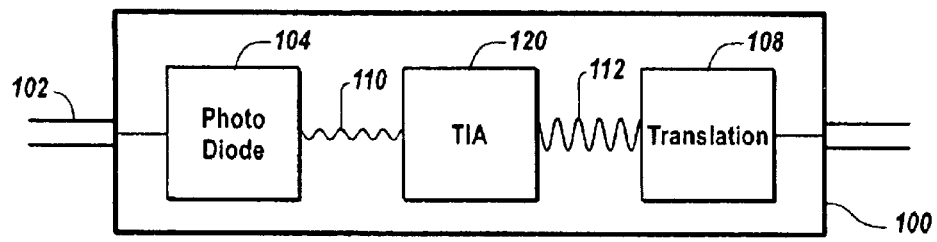
FIG. 1 illustrates an exemplary environment for implementing embodiments of the present invention.

FIG. 1 illustrates an exemplary environment for implementing embodiments of the present invention. FIG. 1 illustrates a fiber optic receiver 100 that receives an optical signal (light) and converts the optical signal to an electrical signal or data stream (usually represented as a voltage). The fiber optic receiver 100 receives an optical signal over an optical fiber 102. A photo diode 104 or other optical device that converts an optical signal to an electrical signal or current (light to electrons conversion) receives the optical signal and generates an electrical signal 110 (current). The transimpedance amplifier 120 amplifies the electrical signal 110 to produce the amplified electrical signal 112. The transimpedance amplifier 120 has a wide dynamic range that is able to amplify signals with large power without significantly diminishing the ability to amplify signals with low power. The amplified electrical signal 112 is then translated by the translation module 108 and converted into an electrical digital signal 114.

Figure 2:
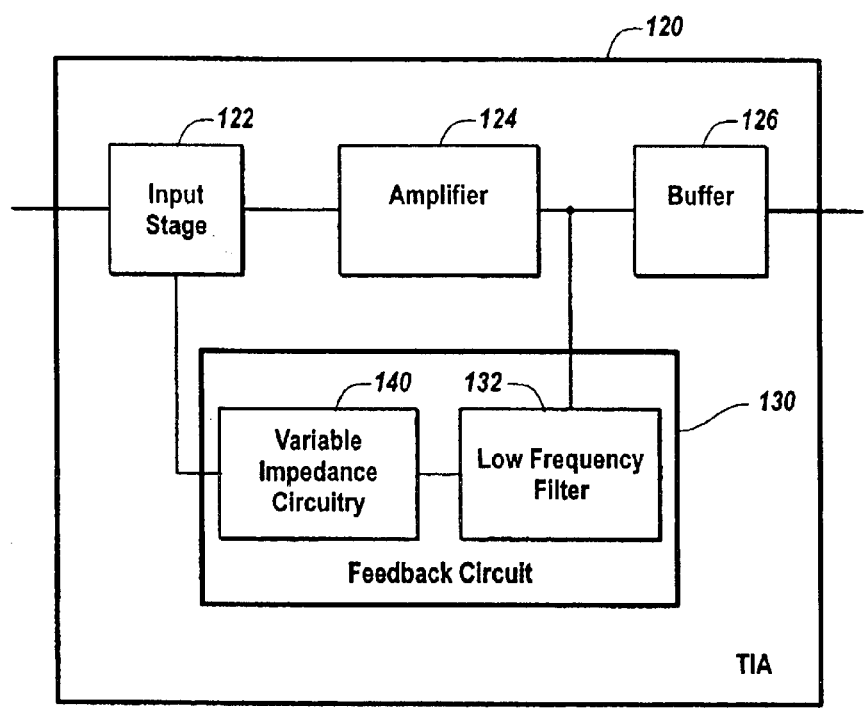
FIG. 2 is a block diagram of a transimpedance amplifier that provides both automatic gain control and DC cancellation.

FIG. 2 illustrates a block diagram of an exemplary transimpedance amplifier in accordance with the present invention. The transimpedance amplifier 120 includes an input stage 122 that receives an electrical current 110 from a photo diode or other device that converts an optical signal into the electrical voltage. An amplifier 124 amplifies the electrical signal and helps reduce or prevent noise from being a factor. A buffer 126 is also optionally provided at the output of the transimpedance amplifier 120. In one embodiment, the input stage 122 and the amplifier 124 are referred to as an forward transimpedance circuit. It is understood by one of skill in the art that the input stage 122 and the amplifier 124 can be implemented in different configurations. Exemplary configurations include, but are not limited to, a common base configuration and a shunt feedback configuration. In addition, the amplifier 124 includes single ended amplification, differential amplification, and the like or any combination thereof.

The feedback circuit 130 provides both automatic gain control and direct current (DC) cancellation for the transimpedance amplifier 120. In the feedback circuit 130, a high frequency filter 132 is used to detect the DC component output by the amplifier 124. The DC component or low frequency component of the output of the amplifier 124 is passed by the high frequency filter 132 and is canceled by the variable impedance circuitry 140. In another embodiment, the high frequency filter 132 may be replaced with a peak detector or similar circuitry.

The variable impedance circuitry 140 also provides automatic gain control for the transimpedance amplifier 120 because it is able to attenuate at least some of the AC content of the photodiode current when the impedance of the variable impedance circuitry 140 decreases. In other words, the impedance of the variable impedance circuitry 140 changes according to the average current of the photodiode. As the average current received from the photodiode or other source increases, the impedance of the variable impedance circuitry decreases. Because the impedance of the variable impedance circuitry 140 decreases, the variable impedance circuitry 140 absorbs or attenuates some of the AC component. This provides automatic control of the transimpedance gain of the fiber optic receiver. When the average photodiode current is low, the impedance of the variable impedance circuitry 140 is relatively large and the AC component is not absorbed or attenuated, but is amplified at the input stage 122 and/or by the amplifier 124. Thus, the optical overload of the transimpedance amplifier is increased without simultaneously trading off the optical sensitivity of the transimpedance amplifier.

In This is advantageous for the transimpedance amplifier 120 because the range of signals that can be amplified without clipping, saturation, or other problems, is increased. Low power signals are also amplified by the transimpedance amplifier 120 as the AC component is not absorbed or attenuated by the variable impedance circuitry 140, while optical signals with higher optical power are partially absorbed or attenuated by the variable impedance circuitry 140. The transimpedance amplifier 120 can thereby successfully amplify a wide range of signals.

Figure 3:
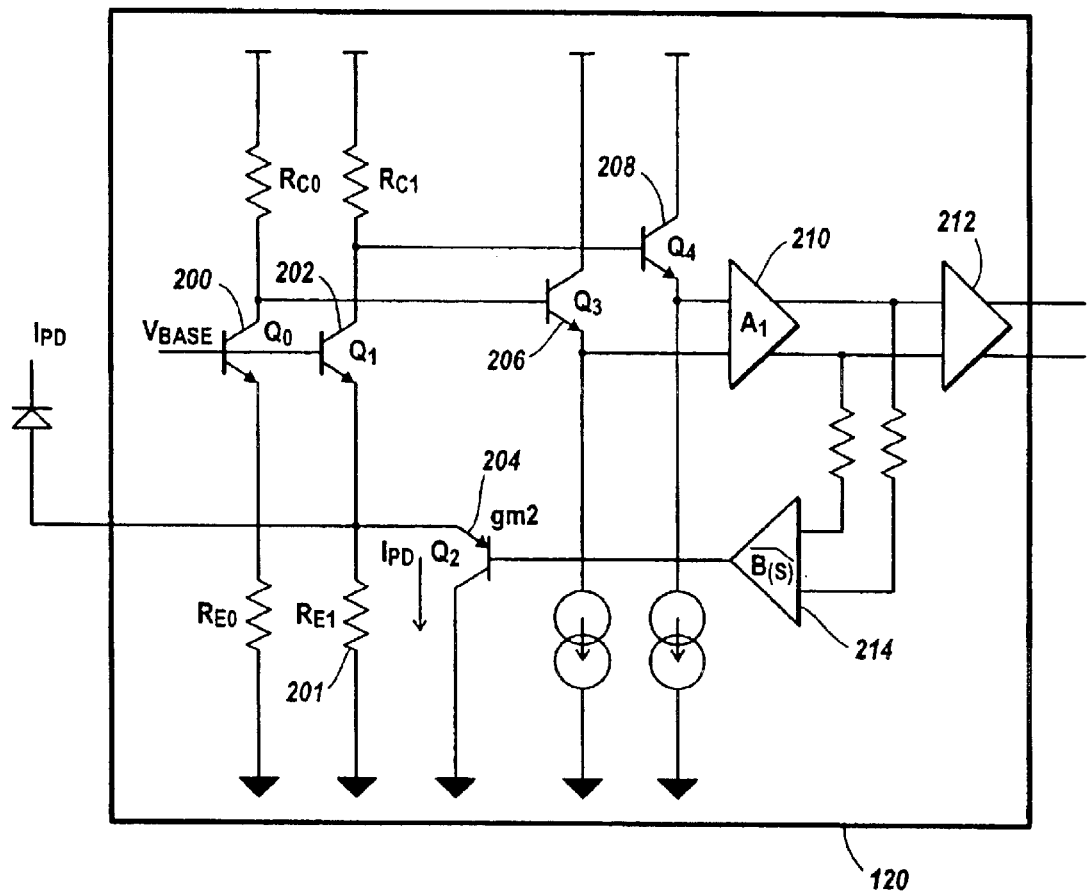
FIG. 3 illustrates one embodiment of the present invention in a common base configuration with a variable impedance formed using a pnp transistor.

FIG. 3 illustrates one embodiment of a transimpedance amplifier 120. The transimpedance amplifier 120 of FIG. 3 utilizes a common base topology with a feedback circuit that provides both low frequency or DC cancellation and automatic gain control, as previously stated. Generally, the transimpedance amplifier includes an amplifier that includes one or more stages. The DC offset or component is sensed by the feedback circuit and eliminated from the input signal. In the example of FIG. 3, the transistors 200 and 202 are included in the input stage. The current from the photodiode is converted to a voltage by the transistor 202. The voltage output by the transistor 200 serves as a reference voltage in this embodiment. An output signal from the transistors 200 and 202 is input to the transistors 206 and 208, which are arranged in an emitter follower configuration such that the voltage at the emitters substantially follows the voltage at the bases of the transistors 206 and 208. The amplifier 210 amplifies the output of the emitter followers (206 and 208).

The DC or low frequency component of the output of the amplifier 210 is passed by the low frequency operational amplifier 214, which is an example of a high frequency filter, and drives the base of the pnp transistor 204. Also, the DC or low frequency component can be sensed at the output of the input stage or at the output of the output of the emitter follower transistors 206 and 208.

FIG. 3, the transistor 204 is a pnp transistor and the DC component or low frequency component detected by the low frequency operational amplifier 214 drives the base of the pnp transistor 204. The emitter of the pnp transistor 204 is also electrically connected with the signal generated by the photodiode. As the average photodiode current increases, the emitter impedance of the transistor 204 decreases. This enables some of the AC component being processed by the transistor 202 to be absorbed by the transistor 204 and permits the transimpedance amplifier to amplify or transmit signals whose optical power is large. The transistor 204 is an example of the variable impedance circuitry of FIG. 2.

Because the transimpedance amplifier shown FIG. 3 uses a pnp transistor instead of a npn transistor for the transistor 204 ($Q_2$), the AC content or component of the photodiode current will be absorbed or attenuated by the transistor 204 when the impedance seen at the emitter of the transistor 204 decreases. This is the case when the photodiode current increases and the optical signal detected by the photodiode has increased power.

Furthermore, the pnp transistor 204 can be replaced with an npn transistor as long as the input signal from the photodiode is not connected at the collector of the npn transistor. The input signal is connected with the emitter of the npn transistor. Also the cathode of the photodiode connector is connected with the emitter of the npn transistor in this embodiment.

The variation of the input impedance at the emitter of the transistor 204 with the average photodiode current provides an automatic control of the transimpedance gain of the receiver with the average photodiode current. In contrast, when an npn transistor is utilized instead of a pnp transistor in the embodiment of FIG. 3 and the collector of the npn transistor is connected to the anode of the photodiode, the base o the output of 214 and the emitter to ground. The AC component of the photodiode current is not attenuated because the impedance seen at the collector of the npn transistor is not dependent on the average photo diode current. In addition, an npn transistor introduces increased open loop gain in the frequency response as the average photodiode current increases. The pnp transistor 204 does not introduce the gain that would otherwise be introduced by an npn transistor.

Figure 4:
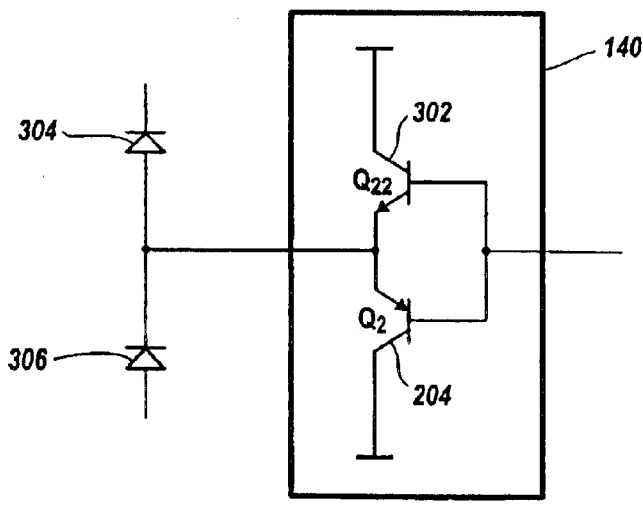
FIG. 4 illustrates an embodiment of feedback circuitry in a transimpedance amplifier where the variable impedance includes both an npn transistor and a pnp transistor, thereby enabling the variable impedance to either source or sink the current from the photodiode.

FIG. 4 illustrates another example of the variable impedance circuitry 140. In this example, a npn transistor 302 is coupled with the pnp transistor 204. More specifically, the emitter of the transistor 302 is connected to the emitter of the transistor 204. This permits the variable impedance circuitry 140 to either source or sink the DC and AC components of current and the photodiode can therefore be connected to either a negative supply (or ground) or a positive supply. If the photodiode 306 is connected to a negative supply or ground, then the npn transistor 302 has a variable impedance that depends on the average current of the photodiode 306. When the photodiode 304 is utilized, then the pnp transistor 204 has a variable impedance that is used for automatic gain control through AC attenuation and DC cancellation.

With reference to FIGS. 2 and 3, the feedback circuit includes a very low gain-bandwidth op-amp (B(s)) driving the base of the transistor 204 and/or the transistor 302 ($Q_{22}$). The feedback circuit senses the DC offset at the output of the $A_1$ gain stage (210) or at the output of the transistors 206 and 208, or other suitable location. Because the gain stage of the amplifier 210 is DC coupled to the input stage of the transimpedance amplifier, any offset between the transistor 200 and transistor 202 collector voltages resulting from a difference of collector current is compensated by the transistor 302 sourcing current at the input of the transimpedance amplifier or the transistor 204 sinking current at the input of the transimpedance amplifier.

As a result, the feedback loop or circuit 130 from the amplifier or gain stage to the input of the transimpedance amplifier removes the DC current or low frequency component of the photodiode signal. Therefore, the transconductance $g_{m2}$ of the transistor 204 is proportional to the average photodiode current and hence the average received optical power (assuming the internal offset generated by the transimpedance amplifier is ignored).

For the transistor 302 ($Q_{22}$) or the transistor 204 ($Q_2$) the transconductance is:

$$g_{m2} = \frac{I_{PD}}{V_T}, \quad (1)$$

where $I_{PD}$ is the average current of the photodiode or other optical device that converts an optical signal in to an electrical signal such as current.

In the frequency range where the transimpedance amplifier junction capacitances and the photodiode input capacitance can be ignored, the closed loop transimpedance transfer function is given by:

$$\frac{V_{out}}{I_{in}} = \frac{\frac{g_{m1}}{g_{m1}+g_{m2}}R_C \cdot A_1}{1+\frac{g_{m1}}{g_{m1}+g_{m2}}R_C \cdot A_1 \cdot g_{m2} \cdot B(s)} \text{ or} \quad (2)$$

$$\frac{V_{out}}{I_{in}} = \frac{A}{1+A\beta} \quad (3)$$

where the forward gain $$A = \frac{g_{m1}}{g_{m1}+g_{m2}}R_C \cdot A_1$$

and the feedback gain $\beta = g_{m2} \cdot B(s)$. The transconductance of the common base input stage is $g_{m1}$ and is set by the base voltage and the resistor $R_E$ 201 in the emitter.

In this example, a low frequency dominant pole OP-AMP with a DC gain of B drives the base of the feedback transistors (pnp transistor 204 ($Q_2$) and/or the npn transistor 302 ($Q_{22}$)). The feedback gain can be written:

$$\beta = g_{m2}\frac{B}{1+\frac{s}{w_0}} \quad (4)$$

The transconductance of the transistors 200 and 202 depend on the voltage $V_{BASE}$ and the resistor $R_E$ in series with their emitters. The bias of the input stage ($I_{C(Q1)}$ and $I_{C(Q0)}$) should be optimized for bandwidth and noise. The bias of the input stage does not depend on the average photodiode current and remains constant when the optical power received at the photodiode changes.

The transimpedance amplifier 120 is examined below from the perspectives of low optical power and of high optical power. At low optical power, $g_{m2} << g_{m1}$ (or $I_{PD} << I_{C(Q1)}$). Therefore, the transimpedance of the transimpedance amplifier transfer function can be simplified:

$$\frac{V_{out}}{I_{in}} = \frac{R_C \cdot A_1}{1+R_C \cdot A_1 \cdot g_{m2} \cdot B(s)} \quad (5)$$

In the signal frequency band at low optical power, the transimpedance value of the transimpedance amplifier becomes:

$$\frac{V_{out}}{I_{in}} = R_C \cdot A_1 \quad (6)$$

At high optical power, where $g_{m1} << g_{m2}$ (or $I_{PD} >> I_{C(Q1)}$)

$$\frac{V_{out}}{I_{in}} = \frac{\frac{g_{m1}}{g_{m2}} \cdot R_C \cdot A_1}{1+\frac{g_{m1}}{g_{m2}} \cdot R_C \cdot A_1 \cdot g_{m2} \cdot B(s)} \quad (7)$$

In the signal frequency band at high optical power, the transimpedance value becomes:

$$\frac{V_{out}}{I_{in}} = \frac{g_{m1}}{g_{m2}} \cdot R_C \cdot A_1 \text{ or} \quad (8)$$

$$\frac{V_{out}}{I_{in}} = \frac{I_{C(Q1)}}{I_{PD}} \cdot R_C \cdot A_1 \quad (9)$$

The low frequency feedback causes the closed loop gain frequency response to have a low frequency cutoff given by:

$$f_{HPF-3dB} = \frac{g_{m1}}{(g_{m1}+g_{m2})} \cdot R_C \cdot A_1 \cdot g_{m2} \cdot B \cdot f_0 \quad (10)$$

where $$f_0 = \frac{w_0}{2\pi}$$

and B is the DC gain of the op-amp.

At low optical power, $g_{m2} << g_{m1}$ (or $I_{PD} << I_{C(Q1)}$). Thus, equation (10) can be simplified and the low frequency cutoff is given by:

$$f_{HPF-3dB} = R_C \cdot A_1 \cdot g_{m2} \cdot B \cdot f_0. \quad (11)$$

At high optical power, $g_{m1} << g_{m2}$ (or $I_{PD} >> I_{C(Q1)}$) and equation (10) can be simplified and the low frequency cutoff is given by:

$$f_{HPF-3dB} = R_C \cdot A_1 \cdot g_{m1} \cdot B \cdot f_0. \quad (12)$$

The low cutoff frequency at high optical power is not dependent on the transistor 204 or on the transconductance of the transistor 204. The low cutoff frequency is controlled. The low cutoff frequency represents the −3 dB low corner frequency in the frequency response of the transimpedance amplifier. The present invention places a limit or controls the low corner frequency at high optical power.

In contrast, a similar analysis applied to a circuit that utilizes an npn transistor in place of the pnp transistor such that the collector of the npn transistor is connected with the input signal or current has a low frequency cutoff that is dependent on the transconductance of the npn transistor. As the average photodiode current increases, the npn transistor causes the transimpedance amplifier to have a higher low frequency cutoff. One disadvantage is that a transimpedance amplifier using an npn transistor in the place of the pnp transistor 204 is that the transimpedance amplifier does not function at lower frequencies for higher optical power or larger input currents. The present invention, however, functions at lower frequencies for higher optical power or larger input currents. This permits embodiments of the transimpedance amplifier to be integrated with existing networks that operate at lower frequencies.

Figure 5:
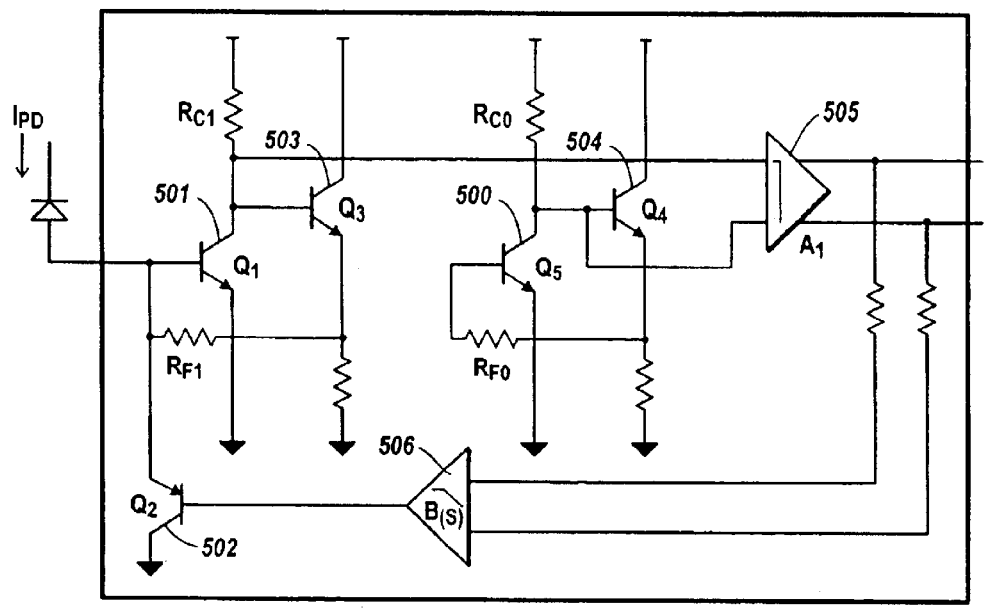
FIG. 5 depicts a shunt feedback transimpedance amplifier with automatic gain control and DC cancellation circuitry.

FIG. 5 is another embodiment of the automatic gain control low frequency feedback loop using a shunt feedback topology. The transistor 502 can be replaced with the circuit illustrated in FIG. 4 to accommodate both a negative and positive supply as previously discussed.

The same analysis can be made for the shunt-feedback transimpedance amplifier configurations that was made for the common base configuration of FIG. 3. Using nodal analysis on the small signal circuit low frequency model of the transimpedance amplifier input stage shunt-feedback amplifier in FIG. 5, the transimpedance transfer function of the transimpedance amplifier can be extracted. In the frequency range where the transimpedance amplifier junction capacitances and the photodiode input capacitance can be ignored, the closed loop transimpedance transfer function is given by:

$$\frac{V_{out}}{I_{in}} = \frac{\frac{g_{m1} \cdot R_C \cdot A_1 \cdot R_F}{1 + g_{m1} \cdot R_C + g_{m2} \cdot R_F}}{1 + \frac{g_{m1} \cdot R_C \cdot R_F}{1 + g_{m1} \cdot R_C + g_{m2} \cdot R_F} \cdot g_{m2} \cdot A_1 \cdot B(s)} \quad \text{or} \quad (13)$$

$$\frac{V_{out}}{I_{in}} = \frac{A}{1 + A \cdot \beta} \quad (14)$$

where $$A = \frac{g_{m1} \cdot R_C \cdot A_1 \cdot R_F}{1 + g_{m1} \cdot R_C + g_{m2} \cdot R_F}$$

(forward gain) and $\beta = g_{m2} \cdot B(s)$ (feedback gain).

At low optical power, where $R_C \cdot g_{m1} >> R_F \cdot g_{m2}$ or $R_F \cdot I_{PD} << R_C \cdot I_{C(Q1)}$, the transimpedance of the transimpedance amplifier transfer function can be simplified as:

$$\frac{V_{out}}{I_{in}} = \frac{R_F \cdot A_1}{1 + R_F \cdot A_1 \cdot g_{m2} \cdot B(s)} \quad (15)$$

In the signal frequency band, the transimpedance value becomes:

$$\frac{V_{out}}{I_{in}} = R_F \cdot A_1 \quad (16)$$

At high optical power, where $R_C \cdot g_{m1} << R_F \cdot g_{m2}$ or $R_F \cdot I_{PD} >> R_C \cdot I_{C(Q1)}$ $$\frac{V_{out}}{I_{in}} = \frac{\frac{g_{m1}}{g_{m2}} \cdot R_C \cdot A_1}{1 + \frac{g_{m1}}{g_{m2}} \cdot R_C \cdot A_1 \cdot g_{m2} \cdot B(s)} \quad (17)$$

In the signal frequency band, the transimpedance value becomes:

$$\frac{V_{out}}{I_{in}} = \frac{g_{m1}}{g_{m2}} \cdot R_C \cdot A_1 \quad \text{or} \quad (18)$$

$$\frac{V_{out}}{I_{in}} = \frac{I_{C(Q1)}}{I_{PD}} \cdot R_C \cdot A_1 \quad (19)$$

The low frequency feedback causes the closed loop gain frequency response to have a low frequency cutoff given by:

$$f_{HPF-3dB} = \frac{g_{m1} \cdot R_C \cdot A_1 \cdot R_F}{1 + g_{m1} \cdot R_C + g_{m2} \cdot R_F} \cdot g_{m2} \cdot B \cdot f_0 \quad (20)$$

where $$f_0 = \frac{w_0}{2\pi}$$

and B is the DC gain of the opamp.

At low optical power, $R_C \cdot g_{m1} >> R_F \cdot g_{m2}$ or $R_F \cdot I_{PD} << R_C \cdot I_{C(Q1)}$. Therefore, equation (20) can be simplified and the low frequency cutoff is given by:

$$f_{HPF-3dB} = R_F \cdot A_1 \cdot g_{m2} \cdot B \cdot f_0 \quad (21)$$

At high optical power, $R_C \cdot g_{m1} << R_F \cdot g_{m2}$ or $R_F \cdot I_{PD} >> R_C \cdot I_{C(Q1)}$. Therefore, equation (20) can be simplified and the low frequency cutoff is given by:

$$f_{HPF-3dB} = R_C \cdot A_1 \cdot g_{m1} \cdot B \cdot f_0 \quad (22)$$

Again, the low frequency cutoff at high optical power is not dependent on the transconductance of the transistor 502.

Figure 6:
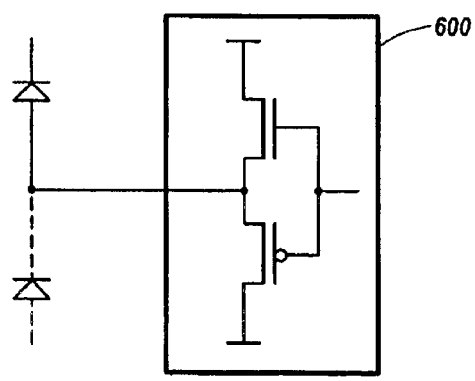
FIG. 6 illustrates another embodiment of feedback circuitry in a transimpedance amplifier using field effect transistors.

FIG. 6 illustrates an alternative embodiment of the variable impedance circuitry using field effect transistors instead of bipolar junction transistors. The variable impedance circuitry can include many types of field effect transistors (MOSFETS, JFETS), BJT transistors, and the like or any combination thereof. In another embodiment of the present invention, the photodiode that receives the optical signal is a photodiode that also amplifies the optical signal or other device that converts the optical signal into an electrical signal or current.

Figure 7:
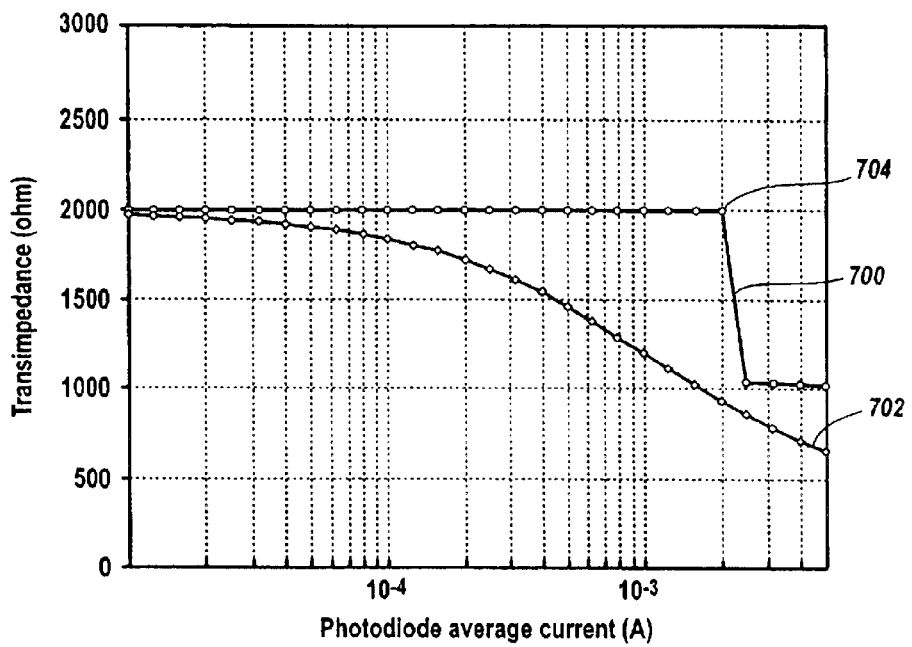
FIG. 7 plots the transimpedance of a transimpedance amplifier versus the average photodiode current.

FIG. 7 is a block diagram that plots the transimpedance of a transimpedance amplifier versus the average current of the photodiode. The plot 700 represents the transimpedance of an existing transimpedance amplifier that utilizes, in one embodiment, an npn transistor for DC cancellation. For the plot 700, the collector of the npn transistor is typically connected with the input signal.

As the average photodiode current increases, the transimpedance of existing transimpedance amplifiers as illustrated by the plot 700 is relatively steady and does not drop until the current gets larger (generally because of the saturation of the input stage). The plot 702, on the other hand, illustrates that the transimpedance of the transimpedance amplifier illustrated in FIG. 3 decreases as the average photodiode current increases. The plot 702 also illustrates that the transimpedance increases as the average photodiode current decreases. At the point 704, for example, the transimpedance illustrated in the plot 700 is much higher than the transimpedance of the plot 702.

The variable impedance circuitry of the present invention, which includes a pnp transistor in one embodiment, enables the transimpedance amplifier to adjust to the transimpedance gain gradually as the average photodiode current increases or decreases.

Figure 8:
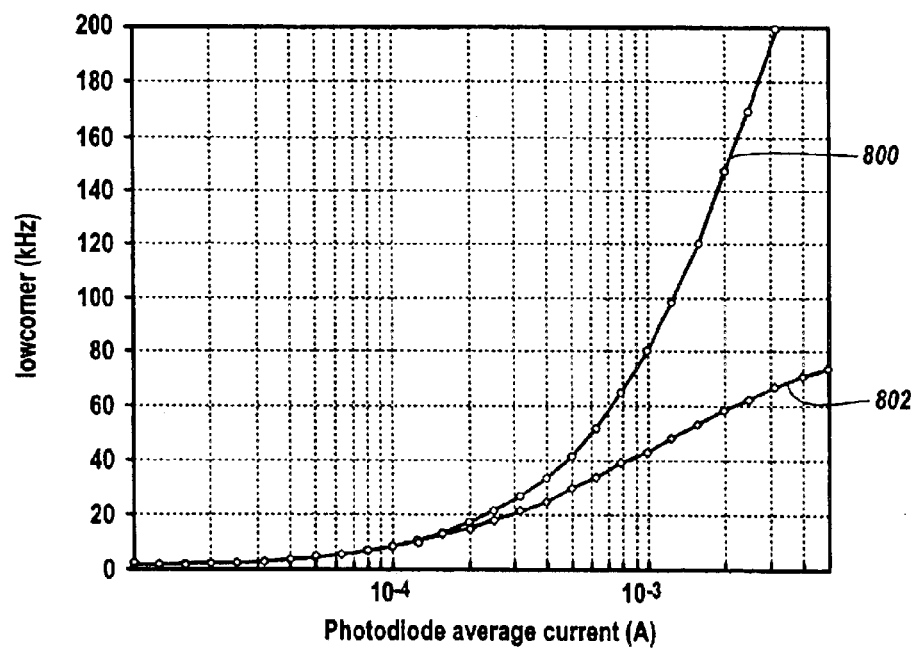
FIG. 8 plots the low cutoff frequency of a transimpedance amplifier versus the average current of the photodiode.

FIG. 8 is a graph that plots the low corner frequency of the transimpedance amplifier as it varies with the average photodiode current. The plot 800 illustrates a plot of the low corner frequency of existing transimpedance amplifiers. The plot 802 illustrates a plot of the low corner frequency of a transimpedance amplifier in accordance with the present invention. More particularly, the plot 802 represents the low corner frequency of the transimpedance amplifier illustrated in FIG. 3.

FIG. 8 illustrates that as the average photodiode current increases, the low cutoff frequency of the plot 800 increases rapidly and linearly. As previously described, this can ultimately result in circuit failure. In other words, the capability to transmit lower data rates at high input power optical sensitivity of the transimpedance amplifier represented by the plot 800 is diminished. The diminished transmission capability results because the low cutoff frequency is not controlled and increases quickly as the input power of the optical signal or of the current from the optical device that converts the optical signal to an input current increases.

In contrast, the low cutoff frequency of the transimpedance amplifier represented by the plot 802 levels off or approaches an upper limit as the average photodiode current increases. Because the increase in the low cutoff frequency in the plot 802 is substantially less than the increase illustrated by the plot 800, the transimpedance amplifier represented by the plot 802 can successfully accommodate a larger range of data rates. The optical sensitivity is improved and the transimpedance amplifier can interact with legacy systems that may operate at lower frequencies.

Figure 9:
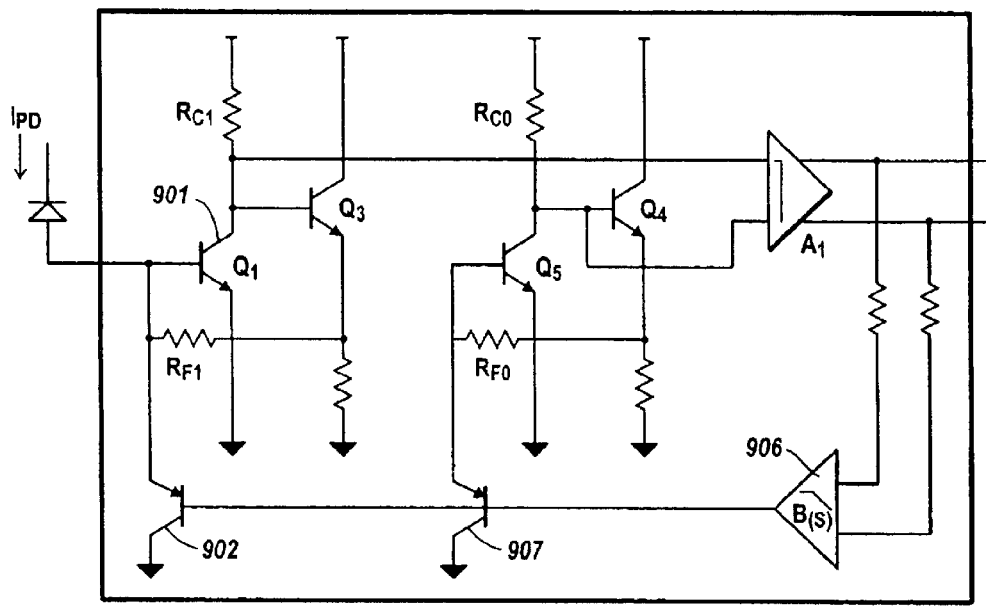
FIG. 9 illustrates another embodiment of a transimpedance amplifier with automatic gain control and DC cancellation circuitry.

FIG. 9 illustrates another embodiment of a transimpedance amplifier with automatic gain control and DC cancellation circuitry. FIG. 9 is similar to FIG. 5 and also includes transistor 907. Transistors 902 and 907 are pnp transistors. The shunt-feedback transimpedance amplifier of FIG. 9 can be used to amplify signals having a wide range of different optical powers. Using nodal analysis on the circuit of FIG. 9, the transimpedance transfer function can be identified. In FIG. 9, transistor 907 can be some factor N smaller in the emitter size than transistor 902. Accordingly, since amplifier 906 cancels DC signals:

$$I_2 = I_{PD} + I_{RF1} \quad (23)$$

and $$I_3 = \frac{I_2}{N} \quad (24)$$

furthermore $$I_{RFS} = I_3 \quad (25)$$

and $$R_{FS} \cdot I_{RFS} = R_{F1} \cdot I_{RF1} \quad (26)$$

and thus $$I_{RFS} = I_{RF1} = I_3 \quad (27)$$

From equations (23)–(27) it can be calculated that:

$$I_{RFS} = I_{RF1} = \frac{I_{PD}}{(N-1)} \quad (28)$$

Additionally, since amplifier 906 cancels DC signals:

$$V_A = V_B = V_{BEQ1} + R_F \cdot \frac{I_{PD}}{(N-1)} + V_{BEQ5} \quad (29)$$

and thus $I_{Q1}$ (the current through $Q_1$) is given by:

$$I_{Q1} = \frac{V_{CC} - V_A}{R_C} = \frac{V_{CC} - 2V_{BE} - R_F \cdot \frac{I_{PD}}{(N-1)}}{R_C} \quad (30)$$

$$= \frac{V_{CC} - 2V_{BE}}{R_C} - \left(\frac{R_F}{R_C}\right) \cdot \left(\frac{I_{PD}}{(N-1)}\right)$$

Thus, $I_{Q1}$ decreases when the photodiode average current increases

The transconductance $g_{m1}$ of transistor 901 ($Q_1$) is given by:

$$g_{m1} = \frac{I_{Q1}}{V_T} = \left[\frac{V_{CC} - 2V_{BE}}{V_T} \cdot \left(\frac{1}{R_C}\right)\right] - \left[\left(\frac{R_F}{R_C}\right) \cdot \left(\frac{I_{PD}}{(N-1)}\right) \cdot \left(\frac{1}{V_T}\right)\right] \quad (31)$$

At high optical power (and similar to equation 22), the low frequency cutoff is given by:

$$f_{HPF-3dB} = R_C \cdot g_{m1} \cdot B \cdot f_0 \quad (32)$$

Similar to FIG. 5, the low frequency cutoff at high optical power is not dependent on the transconductance of the transistor 902. Further, the low frequency cutoff can be adjusted by varying the value of N. Accordingly, the transconductance amplifier of FIG. 9 can provide sufficient gain at a variety of frequencies.

Figure 10:
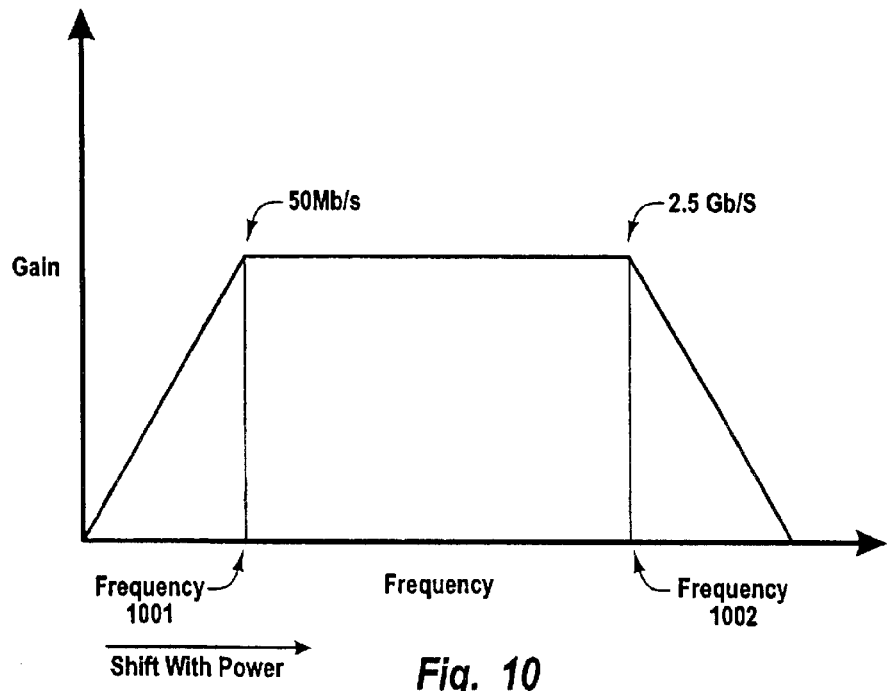
FIG. 10 is an example plot of the gain of a transimpedance amplifier versus frequency.

FIG. 10 is an example plot of the gain of a transimpedance amplifier versus frequency. As depicted in FIG. 10, the circuit of FIG. 9 provides similar gain over a range of frequencies from frequency 1001 to frequency 1002. In one embodiment, frequency 1001 could be set to accommodate a data rate of 50 Mb/s and frequency 1002 could be set to accommodate a data rate of 2.5 Gb/s (or an even higher data rate). Thus, similar gain is provided at data rates ranging from (and including) 50 MB/s to 2.5 GB/s (or an even higher data rate).

Figure 11:
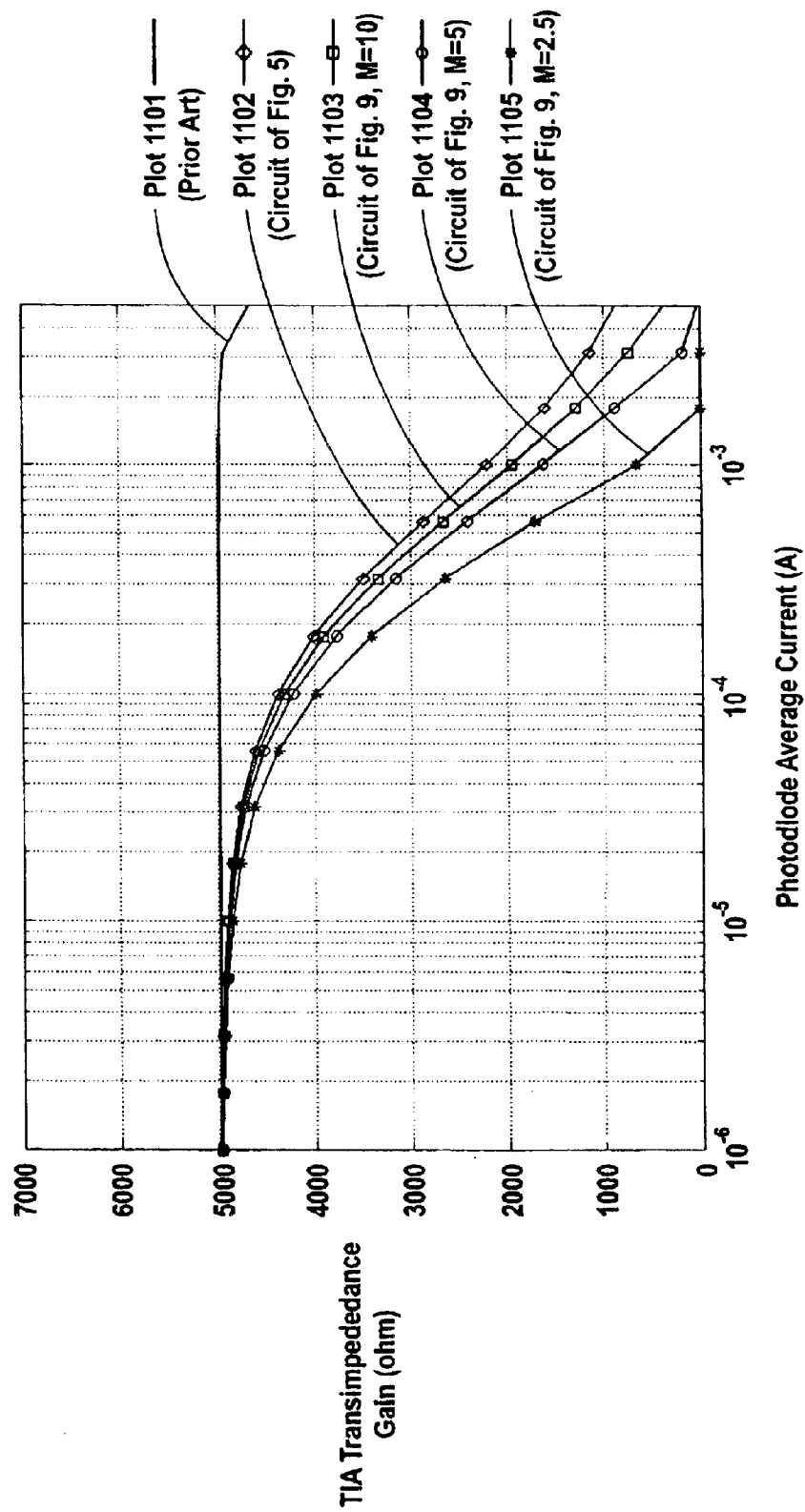
FIG. 11 is an example of a number of plots of transimpedance amplifier transimpedance gain versus photodiode average current.

FIG. 11 is an example of a number of plots of transimpedance amplifier transimpedance gain versus photodiode average current. Plot 1101 depicts an example of transimpedance amplifier transimpedance gain versus photodiode average current for a prior art circuit. Plot 1102 depicts an example of transimpedance amplifier transimpedance gain versus photodiode average current for a circuit (e.g., the circuit of FIG. 5) that uses a pnp transistor (e.g., transistor 502) for gain control. Plot 1103 depicts an example of transimpedance amplifier transimpedance gain versus photodiode average current for a circuit that uses two pnp transistors, having an emitter size ratio M of 10, for gain control. For example, plot 1103 could represent the circuit of FIG. 9 where the emitter size of 902 divided by the emitter size of 907 equals 10.

Plot 1104 depicts an example of transimpedance amplifier transimpedance gain versus photodiode average current for a circuit that uses two pnp transistors, having an emitter size ratio M of 5, for gain control. For example, plot 1104 could represent the circuit of FIG. 9 where the emitter size of 902 divided by the emitter size of 907 equals 5. Plot 1105 depicts an example of transimpedance amplifier transimpedance gain versus photodiode average current for a circuit that uses two pnp transistors, having an emitter size ratio M of 2.5, for gain control. For example, plot 1105 could represent the circuit of FIG. 9 where the emitter size of 902 divided by the emitter size of 907 equals 2.5.

As depicted in FIG. 11, as photodiode average current increases, the transimpedance gain for circuits that utilize two pnp transistors for gain control (e.g., the circuit of FIG.

9) decreases more quickly than the transimpedance gain for prior art circuits and for circuits that utilize one pnp transistor for gain control (e.g., the circuit of FIG. 5). For example, plots 1103, 1104, and 1105 decrease more quickly than plot 1102. Further, as photodiode average current increases, the transimpedance gain for circuits having lower emitter size ratios decreases more quickly than the transimpedance gain for circuits having greater emitter size ratios. For example, plot 1105 (M=2.5) decreases more quickly than both plot 1103 (M=10) and plot 1104 (M=5).

Figure 12:
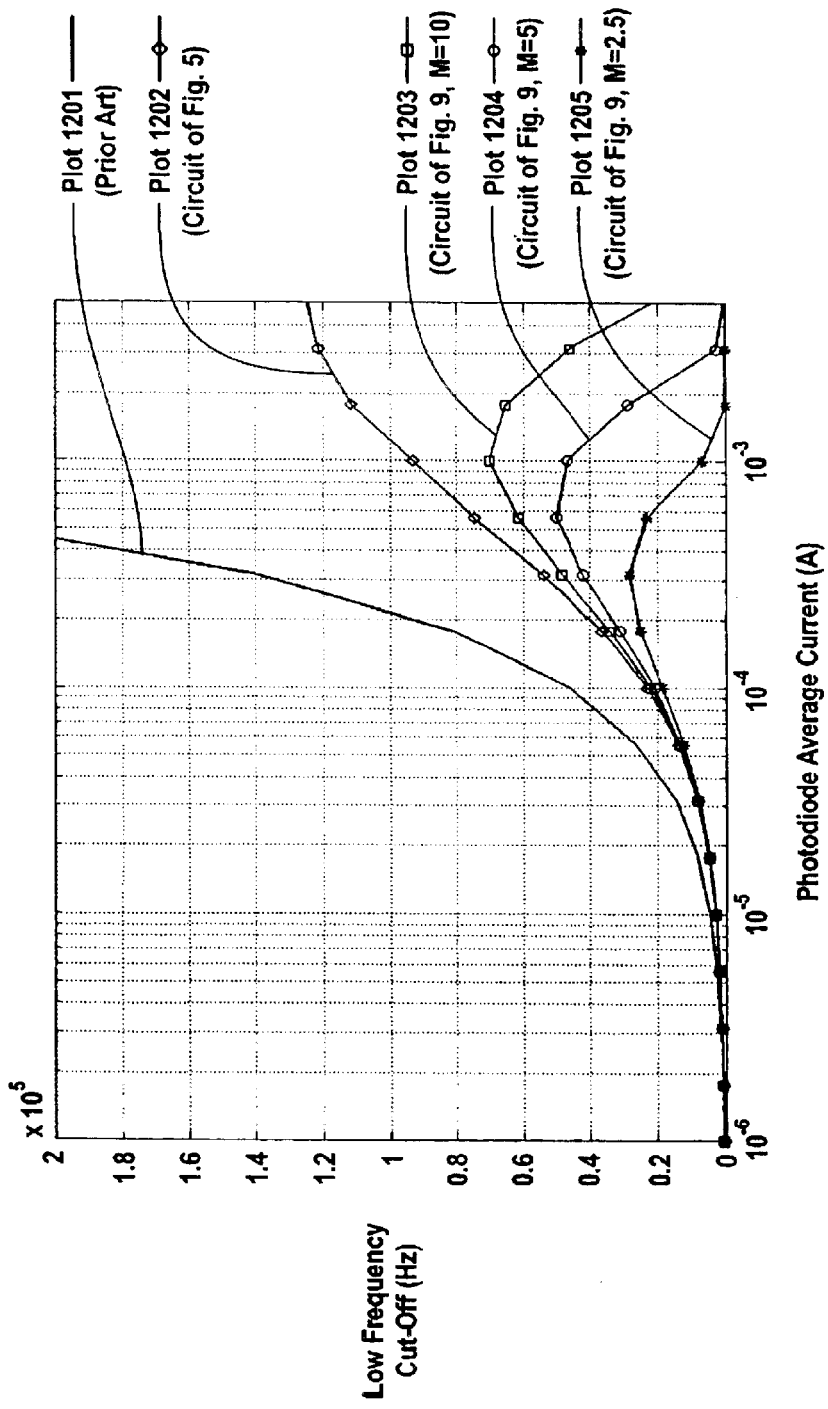
FIG. 12 is an example of a number of plots of transimpedance amplifier low frequency cut-off versus photodiode average current.

FIG. 12 is an example of a number of plots of transimpedance amplifier low frequency cut-off versus photodiode average current. Plot 1201 depicts an example of transimpedance amplifier low frequency cut-off versus photodiode average current for a prior art circuit. Plot 1202 depicts an example of transimpedance amplifier low frequency cut-off versus photodiode average current for a circuit (e.g., the circuit of FIG. 5) that uses a pnp transistor (e.g., transistor 502) for gain control. Plot 1203 depicts an example of transimpedance amplifier low frequency cut-off versus photodiode average current for a circuit that uses two pnp transistors, having an emitter size ratio M of 10, for gain control. For example, plot 1203 could represent the circuit of FIG. 9 where the emitter size of 902 divided by the emitter size of 907 equals 10.

Plot 1204 depicts an example of transimpedance amplifier low frequency cut-off versus photodiode average current for a circuit that uses two pnp transistors, having an emitter size ratio M of 5, for gain control. For example, plot 1204 could represent the circuit of FIG. 9 where the emitter size of 902 divided by the emitter size of 907 equals 5. Plot 1205 depicts an example of transimpedance amplifier low frequency cut-off versus photodiode average current for a circuit that uses two pnp transistors, having an emitter size ratio M of 2.5, for gain control. For example, plot 1203 could represent the circuit of FIG. 9 where the emitter size of 902 divided by the emitter size of 907 equals 2.5.

As depicted in FIG. 12, as photodiode average current increases, the low frequency cut-off for circuits that utilize two pnp transistors for gain control (e.g., the circuit of FIG. 9) is more controlled than the low frequency cut-off for prior art circuits and for circuits that utilize one pnp transistor for gain control (e.g., the circuit of FIG. 5). For example, plots 1203, 1204, and 1205 begin transition lower once photodiode average current reaches a threshold value. Further, as photodiode average current increases, the low frequency cut-off for circuits having lower emitter size ratios transitions to decreasing more quickly than for circuits having greater emitter size ratios. For example, plot 1205 (M=2.5) transitions to decreasing more quickly than both plot 1203 (M=10) and plot 1204 (M=5).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optoelectronic component, comprising:
  a detector configured to receive an optical signal and generate a corresponding input current; and
  a transimpedance amplifier having a controlled low cutoff frequency as an average input current received from the detector at an amplifier input of the transimpedance amplifier increases, the transimpedance amplifier comprising:
    a forward transimpedance circuit configured to receive the input current from the detector and to generate an output signal based on the received input current; and
    a feedback circuit that includes:
      a first circuit configured to detect a low frequency component of the output signal; and
      a second circuit that is driven by the low frequency component of the output signal and is connected to the forward transimpedance circuit such that the impedance of the second circuit presented at the amplifier input decreases as the output signal increases, the second circuit including:
        a first pnp transistor having a first base terminal and a first emitter terminal, wherein the first emitter terminal is connected to the amplifier input; and
        a second pnp transistor having a second base terminal, the second base terminal being connected to the first base terminal, the second pnp transistor having an emitter size that is some factor smaller than an emitter size of the first pnp transistor.

2. The optoelectronic component as recited in claim 1, wherein an impedance seen at the first emitter terminal is dependent on the average input current and wherein the low cutoff frequency does not increase linearly as the input current increases.

3. The optoelectronic component as recited in claim 1, wherein the second circuit has a variable impedance such that increasing an optical overload associated with the transimpedance amplifier does not substantially diminish an optical sensitivity associated with the transimpedance amplifier.

4. The optoelectronic component as recited in claim 1, wherein the first circuit and the second circuit shunt a DC component of the input current such that a DC component of the output signal is significantly reduced.

5. The optoelectronic component as recited in claim 1, wherein the first circuit includes a low frequency operational amplifier.

6. The optoelectronic component as recited in claim 1, wherein the detector comprises a photodiode.

7. The optoelectronic component as recited in claim 1, wherein the detector is configured to receive a data stream in optical form.

8. The optoelectronic component as recited in claim 1, wherein a gain of the transimpedance amplifier is substantially constant for a predetermined range of data rates.

9. The optoelectronic component as recited in claim 8, wherein the predetermined range of data rates extends from about 50 Mb/s to at least about 2.5 Gb/s.

10. The optoelectronic component as recited in claim 1, wherein an emitter size ratio "M," representing a ratio of the size of one of the emitters to the size of the other emitter, is based on a desired gain effect.

11. The optoelectronic component as recited in claim 1, wherein the first circuit comprises a low frequency filter.

12. The optoelectronic component as recited in claim 1, further comprising a translation module configured to:
  receive an amplified signal from the transimpedance amplifier; and
  generate a corresponding digital signal.

13. The optoelectronic component as recited in claim 1, wherein the transimpedance amplifier further comprises a buffer configured and arranged to receive a signal from the forward transimpedance circuit.

14. An optical receiver, comprising:
  a photodiode configured to receive an optical signal and generate a corresponding input current; and
  a transimpedance amplifier having a controlled low cutoff frequency as an average input current received from the photodiode at an amplifier input of the transimpedance amplifier increases, the transimpedance amplifier comprising:
    an input stage configured to generate an output voltage based on the received input current;
    a gain stage configured to amplify the output voltage to generate an amplified signal; and
    a feedback circuit that includes:
      a low frequency circuit configured to detect a low frequency component of the amplified signal; and
      variable impedance circuitry, wherein an impedance of the variable impedance circuitry is dependent on an average input current such that the impedance decreases as the average current increases and wherein a low cutoff frequency of the transimpedance amplifier decreases when the average input current increases to greater than a specified threshold, the variable impedance circuitry including:
        a first pnp transistor having a first base terminal and a first emitter terminal, wherein the first emitter terminal is connected to the amplifier input, the first pnp transistor having a first emitter size; and
        a second pnp transistor having a second base terminal, the second base terminal being connected to the first base terminal, the second pnp transistor having a second emitter size that is some factor smaller than the first emitter size.

15. The optical receiver as recited in claim 14, wherein the input stage comprises a shunt feedback configuration and wherein the gain stage comprises an amplifier.

16. The optical receiver as recited in claim 14, wherein the low frequency circuit comprises a low frequency operational amplifier.

17. The optical receiver as recited in claim 14, wherein the low frequency circuit detects and reduces the low frequency component at the input stage by shunting the low frequency component of the input current.

18. The optical receiver as recited in claim 14, wherein the first pnp transistor that has a transconductance that does not substantially affect the low cutoff frequency of the transimpedance amplifier as the input current increases.

19. The optical receiver as recited in claim 14, wherein the photodiode is configured to receive a data stream in optical form.

20. The optical receiver as recited in claim 14, wherein a gain of the transimpedance amplifier is substantially constant for a predetermined range of data rates.

21. The optical receiver as recited in claim 20, wherein the predetermined range of data rates extends from about 50 Mb/s to at least about 2.5 Gb/s.

22. The optical receiver as recited in claim 14, wherein an emitter size ratio "M," representing a ratio of the size of one of the emitters to the size of the other emitter, is based on a desired gain effect.

23. The optical receiver as recited in claim 14, further comprising a translation module configured to:
  receive an amplified signal from the transimpedance amplifier; and
  generate a corresponding digital signal.

24. The optical receiver as recited in claim 14, wherein the transimpedance amplifier further comprises a buffer configured and arranged to receive a signal from the forward transimpedance circuit.

25. In connection with an optical device that receives optical signals of different magnitudes and that generates an input current whose magnitude corresponds to the magnitude of the received optical signal, a method for controlling a low cutoff frequency as average input current increases, the method comprising:
  receiving an input current from an optical device;
  generating an output signal based on the input current;
  detecting a low frequency component of the output signal;
  utilizing the low frequency component to determine an impedance level of a variable impedance that is related to the input current, the variable impedance being related to the input current such that an increase in input current corresponds to a decrease in the impedance level; and
  controlling the low cutoff frequency such that the low cutoff frequency transitions to decreasing when the magnitude of average input current reaches a specified threshold.

* * * * *